United States Patent
Chang et al.

(10) Patent No.: US 6,716,741 B2
(45) Date of Patent: Apr. 6, 2004

(54) METHOD OF PATTERNING DIELECTRIC LAYER WITH LOW DIELECTRIC CONSTANT

(75) Inventors: Ting-Chang Chang, Hsinchu (TW); Po-Tsun Liu, Hsinchu (TW); Jeng-Tzong Sheu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/120,274

(22) Filed: Apr. 9, 2002

(65) Prior Publication Data

US 2003/0190819 A1 Oct. 9, 2003

(51) Int. Cl.$^7$ .......................................... H01L 21/4763
(52) U.S. Cl. ...................... 438/623; 438/626; 438/633; 438/638; 438/700; 438/949
(58) Field of Search ................................ 438/623, 626, 438/633, 638, 700, 949, FOR 355; 430/296, 315, 917

(56) References Cited

U.S. PATENT DOCUMENTS

| | | | | |
|---|---|---|---|---|
| 5,548,159 A | * | 8/1996 | Jeng ........................... | 257/634 |
| 5,736,016 A | * | 4/1998 | Allen .......................... | 204/237 |
| 6,121,130 A | * | 9/2000 | Chua et al. .................. | 438/623 |
| 6,319,820 B1 | * | 11/2001 | Liu .............................. | 438/633 |
| 6,355,563 B1 | * | 3/2002 | Cha et al. .................... | 438/687 |
| 6,406,994 B1 | * | 6/2002 | Ang et al. .................... | 438/637 |
| 2002/0012884 A1 | * | 1/2002 | Gleason et al. ............. | 430/313 |
| 2002/0045132 A1 | * | 4/2002 | Inoue et al. ................. | 430/296 |
| 2002/0160545 A1 | * | 10/2002 | Anderson et al. ............ | 438/22 |
| 2003/0020180 A1 | * | 1/2003 | Ahn et al. | |

OTHER PUBLICATIONS

Yang et al., "Characterization of Poly(silsesquioxane) by Thermal Curing", Apr. 2001, Proc. Natl. Sci. Counc. ROC(A), vol. 25, No. 6, pp. 339–343.*
Kikkawa, T. "Current and Future Low–k Dielectrics for Cu Interconnects", 2000, IEEE, p. 253–256.*
Wolf S. "Silicon Processing for the VLSI–ERA: vol. 1–Process Technology", 1986, Lattice Pr., vol. 1, p. 476–477.*

* cited by examiner

Primary Examiner—George Fourson
(74) Attorney, Agent, or Firm—J. C. Patents

(57) ABSTRACT

The invention relates to a method for directly patterning a low-k dielectric layer by a high energy flow without using any photoresist layer, so that the exposed portion of the low-k dielectric layer is cured and becomes insoluble to the developing solution. The unexposed portion of the low-k dielectric layer remains soluble to the developing solution and will be removed in the developing process. The performance and reliability of the devices are improved and the fabrication processes are simplified.

1 Claim, 4 Drawing Sheets

METHOD OF PATTERNING DIELECTRIC LAYER WITH LOW DIELECTRIC CONSTANT

BACKGROUND OF THE INVENTION

1. Field of Invention

The present invention relates to a method of patterning a dielectric layer. More particularly, the present invention relates to a method of patterning a dielectric layer with a low dielectric constant k.

2. Description of Related Art

For the high speed integrated circuitry, the dimensions of semiconductor devices become smaller and interconnect pitch density becomes higher. For a common dielectric layer, for example, a silicon oxide layer, due to its high dielectric constant, a high RC delay is easily caused. Therefore, it is common to apply a low dielectric constant (low-k) dielectric layer as an inter-metal dielectric (IMD), which has the advantage such as reducing the interconnection parasitic capacitance, consequently reducing the RC delay, or mitigating the cross talk between metal lines, hence, the operation speed is improved.

In order to further reduce the RC delay and enhance the operation performance, copper, having low resistance, high melting point and high resistance of electromigration, in used in combination with the low-k dielectric layer. Copper wiring lines not only reduce RC delay but also reduce the static capacitance between wiring lines.

Because the etching step of copper metal is difficult to control, a damascene process is usually used to fabricate copper lines and copper plugs.

In the conventional via-first damascene process for forming a copper damascene plug structure, as shown in FIG. 1, a cap nitride layer 102 is formed over metal interconnects (not shown) within a provided substrate 100. Afterwards, a first low-k dielectric layer 104, a stop layer 106, a second low-k dielectric layer 108, a chemical mechanical polishing (CMP) stop layer 110 and a bottom anti-reflection coating (BARC) layer (not shown) are formed in sequence on the cap nitride layer. Then, a patterned first photoresist layer is formed on the BARC layer for defining vias. By using the first photoresist layer as a mask and the cap nitride layer is used as an etching stop layer, a first anisotropic etching process is performed through the layers to form a via opening (not shown).

After removing the first photoresist layer, a gap filling process is performed to fill the via with a polymer material layer to protect the cap nitride layer. After a patterned second photoresist layer is formed on the polymer material layer, a second anisotropic etching process is performed to define a trench opening (not shown), by using the stop layer as an etching stop layer.

Next, a barrier layer 120 is formed on the via opening and the trench opening. Then, a conductive layer 130 is formed on the barrier layer 120 and fills the openings. Then, chemical mechanical polishing (CMP) is performed to accomplish the conventional damascene process. FIG. 1 shows a prior-art copper damascene plug structure manufactured by the cited above process.

However, the polymer material layer covering the via opening provokes a fence profile around top of the via opening. It is because the polymer material layer hinders the etching, resulting in incomplete removal of the second low-k dielectric layer 108.

Furthermore, while the second photoresist layer is subsequently stripped by a photoresist removal process, such as a nitrogen/oxygen plasma ashing process or a nitrogen/hydrogen plasma process, the performed photoresist removal process usually damages the side walls of the second dielectric layer 108, leading to dielectric constant shift of the low-k dielectric layer and increased leakage current. Moreover, the low-k dielectric material of the damaged sidewalls tends to absorb moisture, resulting in poor adhesion and degradation in the follow-up metallization process.

SUMMARY OF THE INVENTION

In light of foregoing, the invention provides a method of patterning a dielectric layer with a low dielectric constant k without provoking damages to the low-k dielectric layer, thereby avoiding poisoned plugs and degradation of metallization. Moreover, the present invention has no need of using photoresist layers for patterning the low-k dielectric layer, thus preventing the remaining residue and incomplete removal problems.

The present invention uses a high energy flow to directly pattern the low-k dielectric layer without using photoresist layers as masks in the photolithography steps. The high energy flow includes x-rays, electron beams, ion beams or any other electromagnetic waves with high energy.

As embodied and broadly described herein, the invention provides a method for patterning a low-k dielectric layer by direct exposure to a high energy flow, so that the exposed portion of the low-k dielectric layer is cured and becomes insoluble to the developing solution. The unexposed portion of the low-k dielectric layer is soluble to the developing solution and will be removed in the developing process.

By not using any photoresist layer in the photolithography process, the low-k dielectric layer is patterned directly by the high energy flow, thus preventing the low-k dielectric layer from being damaging and avoiding the poison plug problems. The performance and reliability of the device are improved and the fabrication processes are simplified.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 3A shows a HOSP material layer patterned by x-ray lithography, while

DESCRIPTION OF THE PREFERRED EMBODIMENTS

Figure 1:
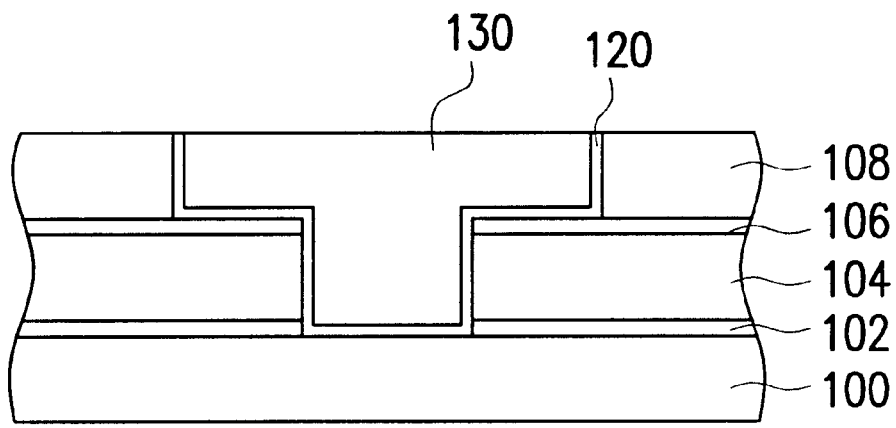
FIG. 1 shows a prior-art copper damascene plug structure manufactured by the conventional via-first damascene process.

Various type of advanced lithographies for IC fabrication have been proposed, including ultraviolet light lithography, electron beam lithography, ion beam lithography and x-ray lithography. Optical exposure lithography is capable of approximately 1 micron resolution and 0.5 micron registration, while electron beam lithography is primarily used to produce photomasks and has 0.5 micron resolution with 0.2 registration. X-ray lithography has a resolution as high as 10–100 angstroms and ion beam lithography has a resolution of approximately 100 angstroms. However, none of these lithographies has been proposed to direct dielectric layer exposure without using photoresist layers. The present invention ingeniously proposes that the aforementioned advanced lithographies are applied directly to pattern the dielectric layer without using intermediate photoresist layers.

Herein, "directly" means that the high energy flow is used to pattern the low-k dielectric layer without using any photoresist layer. In the case of x-ray and short electromagnetic waves, photomasks having desired patterns thereon are used for pattern transferring. However, photomasks can be omitted if ion beam or electron beam is used as the high energy flow.

The present invention uses a high energy flow to directly pattern the low-k dielectric layer without using photoresist layers as masks in the photolithography steps. The high energy flow applying on the spin-on low-k dielectric material can be x-rays, electron beams, ion beams or any other short electromagnetic waves with high energy. Preferably, the high energy flow has an energy density of about 10 W/cm$^2$ to 150 W/cm$^2$. Particularly, the present invention is suitable to be applied in devices with a geometry of less than 0.1 microns.

The following embodiment uses x-ray as an example for the high energy flow, however, the scope of the present invention is not limited thereupon.

The low-k dielectric layers of the present invention are preferably spin-on materials formed by spin-coating. Spin-coating has advantages like, low-cost and efficiency, thus being widely used in the semiconductor manufacture processes. The spin-on materials include spin-on glass (SOG) materials and spin-on polymer (SOP) materials. Between many materials with low dielectric constants, Si—O based materials including inorganic high-molecular-weight compounds, such as, hydrogen silsesquioxane (HSQ, with k=2.8–3.0), organic high-molecular-weight compounds, such as, methyl-silsesquioxane (MSQ, with k=2.5–2.7), hybrid organic siloxane polymer (HOSP, k=2.5) and porous silicate (k<2.0), are considered useful in the present invention. Moreover, photosensitive low-k dielectric materials, such as, photosensitive polyimide (PSPI) materials, can also be applied in the present invention. The photosensitive polyimide materials include negative-type PSPI and positive-type PSPI prepared from poly(amic acid)s or polyimide and a photosensitive compound.

If x-ray is used in combination of silica-based materials as the low-k dielectric layer, the energy of x-ray is about 10–800 eV. If x-ray is used in combination of photosensitive low-k dielectric materials as the low-k dielectric layer, the energy of x-ray is about 1–6 eV.

FIG. 2A through FIG. 2E are schematic, cross-sectional views showing process steps of patterning low-k material layers for a dual damascene opening according to one preferred embodiment of the invention.

Figure 2A:
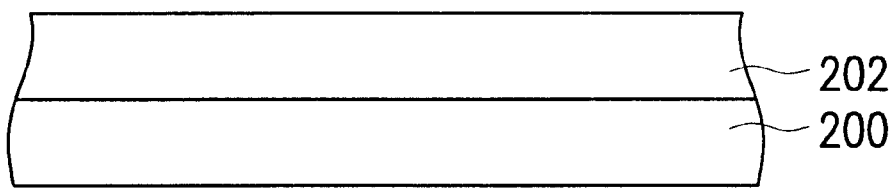
FIG. 2A through FIG. 2E are schematic, cross-sectional views showing process steps for patterning low-k material layers for a dual damascene opening according to one preferred embodiment of the invention.

As shown in FIG. 2A, a substrate 200 is provided. A first low-k material layer 202 is formed on the substrate 200. The first low-k material layer 202 is preferably formed of low-k dielectric materials by spin-coating. The first low-k dielectric materials can be, for example, a low-k Si—O based material or a photosensitive low-k material. The thickness of the first low-k material layer 202 is adjusted according to the design and the requirements of the processes.

Figure 2B:
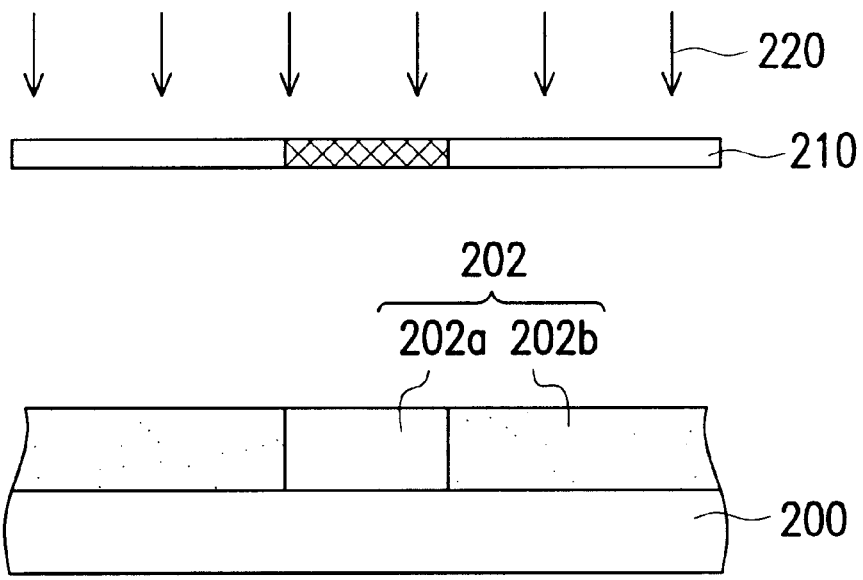

Referring to FIG. 2B, a high energy flow 220 is applied through a first mask 210 onto the first low-k material layer 202 for transferring the pattern of a via opening. The predetermined location for the via opening is not exposed to the high energy flow 220, while the other locations of the first low-k dielectric layer are evenly exposed to the high energy flow 220. The applied high energy flow 220 can be, for example, x-ray, short electromagnetic waves, electron beam or ion beam with an energy density of about 10 watt/cm2 to about 150 watt/cm2 and an application time of about 10 minutes to 120 minutes. For example, the high energy flow is x-ray with an energy density of about 10–20 watt/cm2, preferably 14 watt/cm2, and an application time of about 60 minutes, applied to the first low-k material layer 202 made of hydrogen silsesquioxane (HSQ). As the high energy flow applied to the first low-k material layer 202, energy of the high energy flow 220 is strong enough to make cross-linking occur in the first low-k material layer 202. That is, the first low-k material layer 202 is selectively cured by the high energy flow 220. In the curing process, the exposed portion 202b of the first low-k material layer 202 changes into a network structure and becomes insoluble to the developing solution. On the other hand, the unexposed portion 202a is not cured and still soluble to the developing solution. So far, the first low-k material layer 202 is patterned but not developed.

Figure 2C:
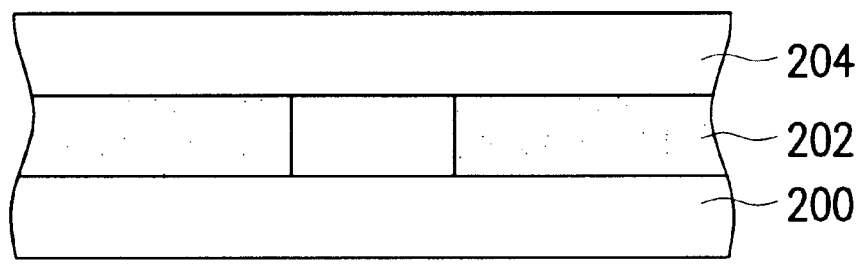

Referring to FIG. 2C, a second low-k material layer 204 is formed on the patterned first low-k material layer 202. Preferably, the second low-k material layer 204 is made of the same materials for forming the first low-k material layer 202. Therefore, one single developing step is needed to develop both layers. However, the second low-k material layer 204 and the first low-k material layer 202 can be made of different materials, depending on the processing requirements. The thickness of the second low-k material layer 204 is adjusted according to the design and the requirements of the processes.

Figure 2D:
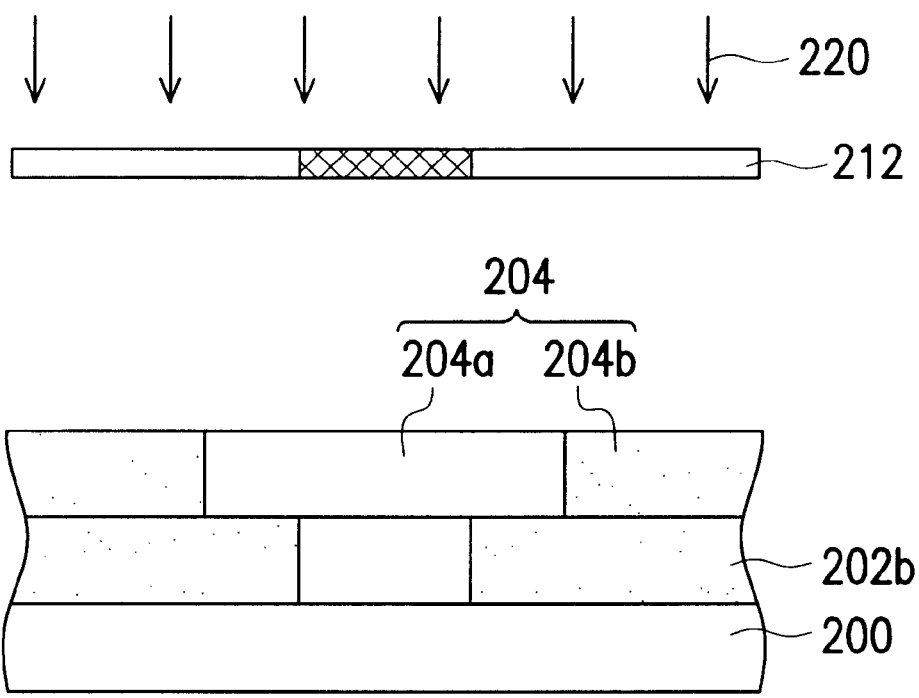

FIG. 2D, the high energy flow 220 is applied through a second mask 212 onto the second low-k material layer 204 for transferring the pattern of a trench opening. The predetermined location for the trench opening is not exposed to the high energy flow 220, while the other locations of the second low-k dielectric layer are evenly exposed to the high energy flow 220. The applied high energy flow 220 can use the same energy density as used in the process of FIG. 2B, for example, about 10–20 watt/cm2, preferably 14 watt/cm2, and an application time of about 60 minutes, applied to the second low-k material layer 204 made of hydrogen silsesquioxane (HSQ). However, the energy density and the application time used in the process of FIG. 2D can be adjusted according to the material used in the second low-k material layer 204. The energy of the high energy flow 220 is strong enough to make cross-linking occur in the second low-k material layer 204. That is, the second low-k material layer 204 is selectively cured by the high energy flow 220. In the curing process, the exposed portion 204b of the second low-k material layer 204 changes into a network structure and becomes insoluble to the developing solution, while the unexposed portion 204a is not cured and soluble to the developing solution.

Figure 2E:
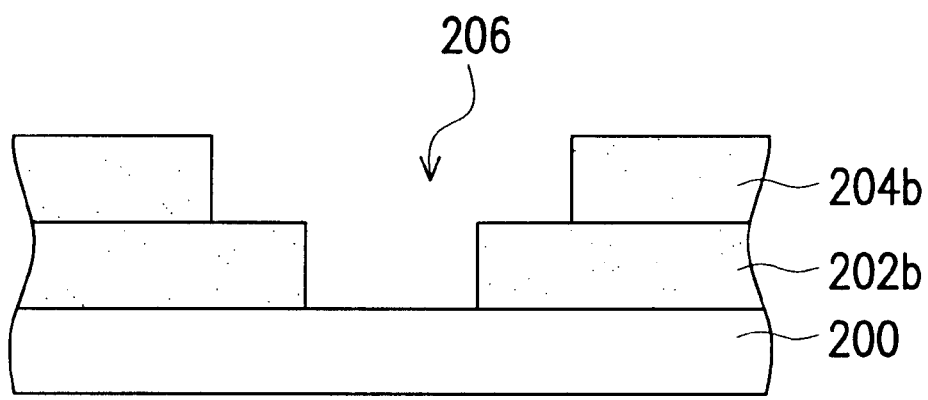

As shown in FIG. 2E, a developing step is performed to develop both the first and the second low-k material layers 202, 204, thus forming a dual damascene opening 206. The developing solution used in the developing step can be, for example, spin-coating solvents.

Afterwards, a baking process is performed for eliminating water absorption. The substrate 200 is placed on a hot plate and baked for about 10–30 minutes under 200° C.–400° C. This baking process also enhances the mechanical strengths of both low-k materials layers.

The following processes for completing a dual damascene structure, including forming a barrier layer, depositing a conductive material to fill the dual damascene opening and planarization step, are not the main features of the present invention and well-known in the art, so that no further descriptions are provided therein.

Figure 3A:
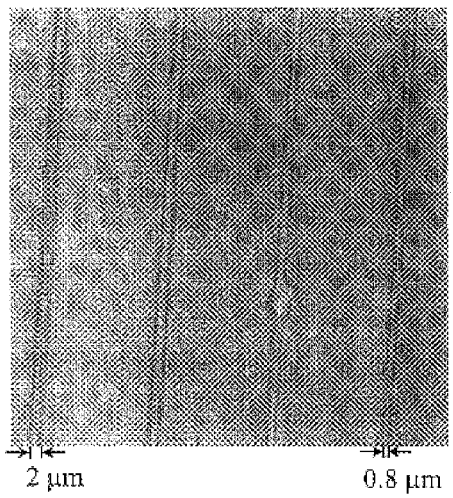
Figure 3B:
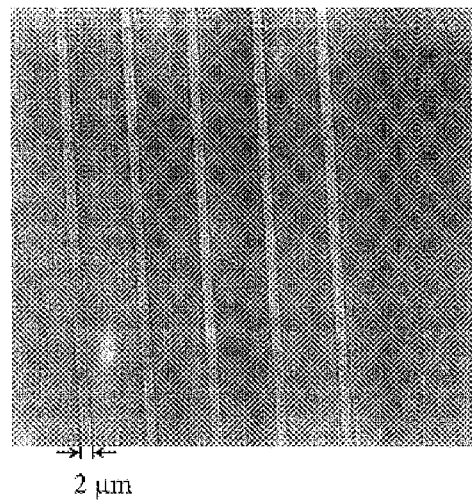
FIG. 3B shows a HSQ material layer patterned by x-ray lithography according to one preferred embodiment of this invention.

FIG. 3A shows a HOSP material layer patterned by x-ray lithography, while FIG. 3B shows a HSQ material layer patterned by x-ray lithography according to one preferred embodiment of this invention. From FIGS. 3A and 3B, the HOSP layer and the HSQ layer are both patterned by being directly exposed to x-ray without using any photoresist layer in-between. The resultant pattern in FIG. 3A has a dimension as small as 0.8 micron.

Obviously, this invention is not restricted to the formation of a dual damascene opening in two low-k dielectric layers. This invention is applicable to pattern multi-layered low-k dielectric layers by repeatedly patterning each individual layer. This invention is also applicable to the formation of contact/via/interconnect openings or advanced pattern transferring of low-k dielectric layers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for patterning a dielectric layer to form an opening in the dielectric layer, comprising:

providing a substrate;

forming a dielectric layer on the substrate by spin-coating;

providing a photomask having a pattern;

applying a X-ray beam directly to the dielectric layer to selectively cure the dielectric layer without using a photoresist layer, wherein the photomask is used for transferring the pattern onto the dielectric layer;

performing a developing process to form an opening in the dielectric layer by using a developing solution, wherein a portion of the dielectric layer is exposed to the X-ray beam and cured, thus becoming insoluble to the developing solution, and wherein an unexposed portion of the dielectric layer is soluble to the developing solution and is thus removed to form the opening; and after performing the developing process, a baking process is performed to eliminate water absorption;

wherein a material of the dielectric layer is a silica-based spin-on material, and the silica-based spin-on material comprises porous silicate.

* * * * *